United States Patent
Horinouchi et al.

(10) Patent No.: US 9,948,089 B2
(45) Date of Patent: Apr. 17, 2018

(54) DC CIRCUIT BREAKER DEVICE

(71) Applicant: MITSUBISHI ELECTRIC CORPORATION, Chiyoda-ku (JP)

(72) Inventors: Katsuhiko Horinouchi, Chiyoda-ku (JP); Motohiro Sato, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 269 days.

(21) Appl. No.: 14/911,349

(22) PCT Filed: Apr. 11, 2014

(86) PCT No.: PCT/JP2014/060479
§ 371 (c)(1),
(2) Date: Feb. 10, 2016

(87) PCT Pub. No.: WO2015/087558
PCT Pub. Date: Jun. 18, 2015

(65) Prior Publication Data
US 2016/0204596 A1    Jul. 14, 2016

(30) Foreign Application Priority Data
Dec. 11, 2013  (JP) .................................. 2013-255683

(51) Int. Cl.
*H02H 3/033*   (2006.01)
*H02H 3/38*    (2006.01)
(Continued)

(52) U.S. Cl.
CPC ................ *H02H 3/38* (2013.01); *H01H 9/54* (2013.01); *H01H 33/596* (2013.01); *H03K 17/08128* (2013.01); *H03K 17/567* (2013.01)

(58) Field of Classification Search
USPC .......................................................... 361/4
See application file for complete search history.

(56) References Cited

U.S. PATENT DOCUMENTS 5,737,162 A * 4/1998 Ito .................... H01H 33/596
                                                    361/13
9,401,599 B2 * 7/2016 Har-Shai ................ H02H 7/20
(Continued)

FOREIGN PATENT DOCUMENTS

CN   101505054 A   8/2009
CN   103346528 A   10/2013
(Continued)

OTHER PUBLICATIONS

International Search Report dated May 13, 2014 in PCT/JP2014/060479 filed Apr. 11, 2014.
(Continued)

*Primary Examiner* — Ronald W Leja
(74) *Attorney, Agent, or Firm* — Oblon, McClelland, Maier & Neustadt, L.L.P.

(57) ABSTRACT

In a DC circuit breaker device, first and second semiconductor switches are connected in series on a main circuit line such that current-carrying directions of the switches are opposite to each other. A first diode is connected in anti-parallel with the first semiconductor switch, and a second diode is connected in anti-parallel with the second semiconductor switch. First and second mechanical circuit breakers are connected in series with each other and in parallel with the whole of the first and semiconductor switches. First and second backward current generation circuits are connected in series with each other and in parallel with the whole of the first and second mechanical circuit breakers. An injection switch is connected between a node between the first and second mechanical circuit breakers and a node between the first and second backward current generation circuits.

11 Claims, 13 Drawing Sheets

(51) Int. Cl.
*H01H 9/54* (2006.01)
*H03K 17/567* (2006.01)
*H01H 33/59* (2006.01)
*H03K 17/0812* (2006.01)

(56) References Cited

U.S. PATENT DOCUMENTS

| | | | |
|---|---|---|---|
| 9,692,226 B2 * | 6/2017 | Davidson | H02H 3/087 |
| 2005/0146814 A1 | 7/2005 | Sellier et al. | |
| 2009/0201617 A1 | 8/2009 | Yamaguchi | |
| 2012/0050933 A1 | 3/2012 | Xu et al. | |
| 2012/0299393 A1 | 11/2012 | Häfner et al. | |
| 2014/0332500 A1 * | 11/2014 | Pessina | H01H 33/04 |
| | | | 218/4 |
| 2015/0333504 A1 * | 11/2015 | Qi | H02H 3/087 |
| | | | 361/63 |
| 2016/0204596 A1 * | 7/2016 | Horinouchi | H03K 17/08128 |
| | | | 361/101 |
| 2016/0285250 A1 * | 9/2016 | Lee | H01H 9/54 |
| 2017/0288388 A1 * | 10/2017 | Horinouchi | H01H 77/02 |

FOREIGN PATENT DOCUMENTS

| | | |
|---|---|---|
| JP | 59-128714 A | 7/1984 |
| JP | 62-7738 U | 1/1987 |
| JP | 2-56332 U | 4/1990 |
| JP | 10-126961 A | 5/1998 |
| JP | 11-234894 A | 8/1999 |
| JP | 2008-270171 A | 11/2008 |
| JP | 2012-55158 A | 3/2012 |

OTHER PUBLICATIONS

Notice of Allowance dated Sep. 20, 2016 in Japanese Patent Application No. 2015-552338 (with English language translation).
Extended European Search Report dated Jul. 13, 2017 in Patent Application No. 14869389.8.
Combined Chinese Office Action and Search Report dated Jul. 18, 2017 in Patent Application No. 201480047236.9 (with partial English translation and English translation of categories of cited documents).

* cited by examiner

DC CIRCUIT BREAKER DEVICE

TECHNICAL FIELD

The present invention relates to a DC circuit breaker device for use in a DC power system, which is used, for example, for switching a load current on/off in a normal state and for interrupting a fault current upon occurrence of a fault.

BACKGROUND ART

A direct current (DC) circuit breaker device used in a DC power system is significantly different in configuration and operation from an alternating current (AC) circuit breaker device used in an AC power system. A mechanical AC circuit breaker commonly used in an AC power system, such as a gas-blast circuit breaker, a vacuum circuit breaker, and an air-blast circuit breaker, cannot interrupt a current unless a current value becomes zero. Thus, a mechanical AC circuit breaker interrupts a current at the timing of a current value of a fault current becoming zero, which happens for every half cycle of an alternating current.

A mechanical DC circuit breaker device, on the other hand, needs to be designed such that a current value is forced to be zero, since a direct current does not naturally reach a zero point. In addition, depending on the operation of a DC power system, a direction of a direct current flow may be switched to the opposite direction. Thus, a DC circuit breaker device usually needs to be adapted to a bidirectional current.

For example, a DC circuit breaker device illustrated in FIG. 2 of Japanese Patent Laying-Open No. 59-128714 (PTD 1) is known as an example of mechanical DC circuit breaker devices adapted to a bidirectional current and designed to force a current to be zero. The DC circuit breaker device of this document includes two mechanical circuit breakers connected in series with each other, and two backward current generation circuits connected in parallel with the two mechanical circuit breakers and connected in series with each other. Each backward current generation circuit has a capacitor and a reactor connected in series with each other. An injection switch is connected between a node between the two mechanical circuit breakers and a node between the two backward current generation circuits. Upon occurrence of a fault, the injection switch is turned on to zero a current in one of the mechanical circuit breakers through which a current flows in a direction opposite to a direction of a fault current, thereby interrupting the current.

Unlike the mechanical DC circuit breaker device as described above, a DC circuit breaker device including a semiconductor switch does not need to be designed such that a current value is forced to be zero, and can interrupt a current by opening the semiconductor switch. With a semiconductor switch, however, there is an issue of power loss in a normal current-carrying state, that is, in a closed state. This is because, unlike a current flow through metallic contacts as in a mechanical circuit breaker, passing a load current through a semiconductor switch results in Joule heat generation by a resistance component of the semiconductor switch. Since a semiconductor switch usually has the function of carrying a current in one direction, two semiconductor switches are usually connected in series in opposite directions from each other so as to allow for a bidirectional current flow.

In order to avoid the issue of power loss in a semiconductor switch, there is known a DC circuit breaker device including a mechanical circuit breaker provided in parallel with a semiconductor switch. For example, in a current-limiting device described in Japanese Patent Laying-Open No. 10-126961 (PTD 2), a current flows through a mechanical circuit breaker in a normal state, and upon occurrence of a fault, the current is interrupted by the mechanical circuit breaker and commutated to a semiconductor switch, and ultimately, a direct current is limited by the semiconductor switch. By using a very large resistive element such as a lightning arrester as a current-limiting element, the effect is that the current can be practically interrupted.

CITATION LIST

Patent Documents

PTD 1: Japanese Patent Laying-Open No. 59-128714
PTD 2: Japanese Patent Laying-Open No. 10-126961

SUMMARY OF INVENTION

Technical Problem

In the DC circuit breaker device illustrated in FIG. 2 of Japanese Patent Laying-Open No. 59-128714 (PTD 1) described above, when the two mechanical circuit breakers are simultaneously opened when interrupting a fault current, an arc is initially generated in both mechanical circuit breakers. Then, the arc is extinguished in only one of the mechanical circuit breakers due to the formation of a current zero point by a backward current from the backward current generation circuit. On this occasion, a current twice as large flows through the other mechanical circuit breaker in which a current zero point is not formed. This results in the generation of high arc heat, which not only damages contacts but deteriorates insulation performance. In order to avoid this problem, if only one of the mechanical circuit breakers in which a current zero point is to be formed is opened, a recovery voltage immediately after interruption needs to be withstood only by the opened mechanical circuit breaker, resulting in the need for an expensive mechanical circuit breaker having high insulation performance.

In the DC circuit breaker device described in Japanese Patent Laying-Open No. 10-126961 (PTD 2) described above, a direct current is commutated to the semiconductor switch by being interrupted by the mechanical circuit breaker. However, since a mechanical circuit breaker cannot interrupt a current unless a current value becomes zero, the commutation to the semiconductor switch cannot be sufficiently conducted. In particular, when the semiconductor switch has relatively high ON resistance, the commutation cannot be conducted since arc resistance between contacts of the mechanical circuit breaker during the commutation process does not become higher than the ON resistance of the semiconductor switch.

The present invention has been made in consideration of the problems described above, and an object of the present invention is to provide an inexpensive DC circuit breaker device having high insulation performance while a bidirectional direct current is interrupted and wear and damage caused by an arc are reduced.

Solution to Problem

A DC circuit breaker device according to the present invention includes a first semiconductor switch and a second semiconductor switch, a first diode and a second diode, a first mechanical circuit breaker and a second mechanical circuit breaker, a first backward current generation circuit and a second backward current generation circuit, an injection switch, and a controller. The first semiconductor switch and the second semiconductor switch are connected in series between a first node on a main circuit line and a second node on the main circuit line such that current-carrying directions of the switches are opposite to each other. The first diode is connected in parallel with the first semiconductor switch to carry a current in a direction opposite to the current-carrying direction of the first semiconductor switch. The second diode is connected in parallel with the second semiconductor switch to carry a current in a direction opposite to the current-carrying direction of the second semiconductor switch. The first mechanical circuit breaker and the second mechanical circuit breaker are successively connected in series between the first node and the second node, and connected in parallel with the whole of the first semiconductor switch and the second semiconductor switch. The first backward current generation circuit and the second backward current generation circuit are successively connected in series between the first node and the second node, and connected in parallel with the whole of the first semiconductor switch and the second semiconductor switch and in parallel with the whole of the first mechanical circuit breaker and the second mechanical circuit breaker. The first backward current generation circuit and the second backward current generation circuit are provided so as to pass a backward current through the first mechanical circuit breaker and the second mechanical circuit breaker, respectively. The injection switch is connected between a third node between the first mechanical circuit breaker and the second mechanical circuit breaker and a fourth node between the first backward current generation circuit and the second backward current generation circuit. The controller controls timing of opening/closing the first semiconductor switch, the second semiconductor switch, the first mechanical circuit breaker, the second mechanical circuit breaker, and the injection switch.

Advantageous Effects of Invention

According to the present invention, a bidirectional direct current can be interrupted by providing two semiconductor switches in series, two mechanical circuit breakers in series, and two backward current generation circuits in series.

Further, when interrupting a first direct current flowing in a direction from the first node to the second node, the first mechanical circuit breaker can be opened with a backward current flowing through the first mechanical circuit breaker by the first backward current generation circuit, and then, after a main current is commutated to the semiconductor switch and the diode, the second mechanical circuit breaker can be opened. Conversely, when interrupting a second direct current flowing in a direction from the second node to the first node, the second mechanical circuit breaker can be opened with a backward current flowing through the second mechanical circuit breaker by the second backward current generation circuit, and then, after a main current is commutated to the semiconductor switch and the diode, the first mechanical circuit breaker can be opened. According to the present invention, the first and second mechanical circuit breakers can be opened in the aforementioned order, so that an inexpensive DC circuit breaker having high insulation performance can be provided while wear and damage caused by an arc are reduced.

BRIEF DESCRIPTION OF DRAWINGS

FIG. 4 is a diagram showing a current flow when an injection switch 8 is turned on.

DESCRIPTION OF EMBODIMENTS

Embodiments of the present invention will be hereinafter described in detail with reference to the drawings. The same or corresponding parts are designated by the same reference signs and the description thereof will not be repeated.

First Embodiment

[Configuration of DC Circuit Breaker Device]

Figure 1:
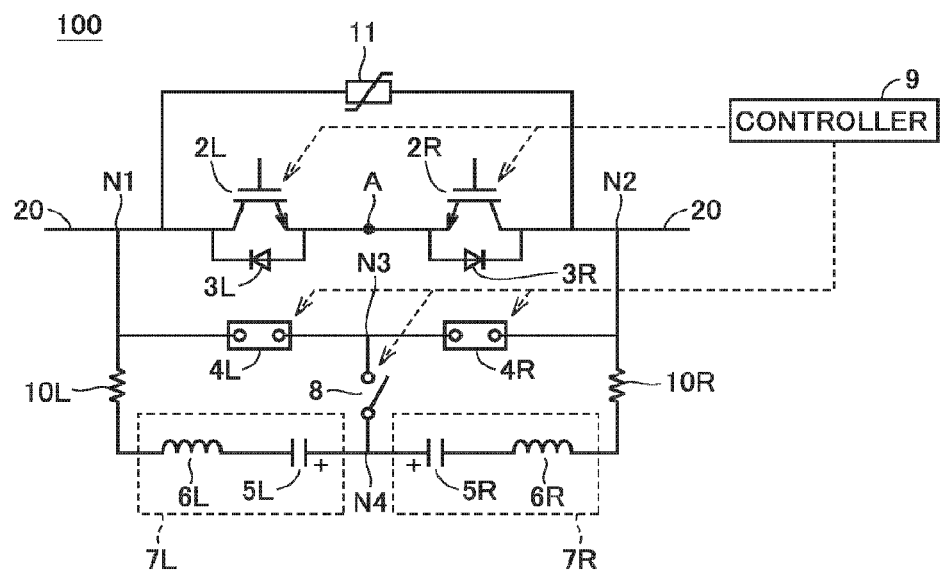
FIG. 1 is a circuit diagram representing a DC circuit breaker device 100 according to a first embodiment.

FIG. 1 is a circuit diagram representing a DC circuit breaker device 100 according to a first embodiment. FIG. 1 shows a steady state when a fault current is not flowing through DC circuit breaker device 100.

As shown in FIG. 1, DC circuit breaker device 100 is provided on a main circuit line 20, and includes semiconductor switches 2L and 2R, diodes 3L and 3R, mechanical circuit breakers 4L and 4R, backward current generation circuits 7L and 7R, an injection switch 8, a controller 9, resistive elements 10L and 10R, and a lightning arrester 11.

Semiconductor switches 2L and 2R are connected in series with each other in this order of arrangement between nodes N1 and N2 on main circuit line 20. Semiconductor switch 2R interrupts a current in a direction opposite to a current-carrying direction of semiconductor switch 2L. For example, in the case of IGBTs (Insulated Gate Bipolar Transistors) shown in FIG. 1, a connection node A between semiconductor switches 2L and 2R corresponds to the emitter side of each IGBT. Accordingly, in the case of FIG. 1, semiconductor switch 2L can carry or interrupt a current in a direction from a node N1 to node A, and semiconductor switch 2R can carry or interrupt a current in a direction from a node N2 to node A.

Diode 3L is connected in parallel with semiconductor switch 2L, and can carry a current in a direction opposite to the current-carrying direction of semiconductor switch 2L. In the case of FIG. 1, diode 3L has an anode connected to the emitter of the IGBT. Likewise, diode 3R is connected in parallel with semiconductor switch 2R, and can carry a current in a direction opposite to the current-carrying direction of semiconductor switch 2R. In the case of FIG. 1, diode 3R has an anode connected to the emitter of the IGBT.

Each of semiconductor switches 2L and 2R is formed of, for example, a semiconductor element such as an IGBT, a GTO (Gate Turn-Off) thyristor, or a power MOS (Metal Oxide Semiconductor) transistor including SiC. Each of semiconductor switches 2L and 2R may instead be formed of a plurality of these semiconductor elements connected in series or in parallel. Each of diodes 3L and 3R may likewise be formed of a plurality of diodes. Further, a plurality of pairs each including semiconductor switch 2L and diode 3L may be connected in series, and a plurality of pairs each including semiconductor switch 2R and diode 3R can be connected in series.

Mechanical circuit breakers 4L and 4R are connected in series in this order of arrangement between nodes N1 and N2, and in parallel with the whole of semiconductor switches 2L and 2R. Each of mechanical circuit breakers 4L and 4R may be replaced by a plurality of mechanical circuit breakers.

Each of mechanical circuit breakers 4L and 4R is formed of, for example, a gas-blast circuit breaker, a vacuum circuit breaker, or an air-blast circuit breaker. These circuit breakers have metallic contacts, and are configured to drive one of the contacts by an operating device for performing mechanical opening/closing operation. When the opening operation is performed during a current flow, an arc is generated between the contacts. The arc is extinguished at the moment when a current value becomes zero such as with alternating current, and the current is interrupted.

An arc is plasma having a temperature as extremely high as 20000 K. When an ignited state continues for an extended period of time, a high current flows for an extended period of time, resulting in wear of and damage to contacts of a mechanical circuit breaker. Further, in the case of a gas-blast circuit breaker or an air-blast circuit breaker, gas or air serving as an arc-extinguishing medium is elevated in temperature, resulting in lower insulation performance immediately after arc extinction as compared to when opening operation is performed without arc ignition. In the case of a vacuum circuit breaker, although there is no arc-extinguishing gas, more thermal electrons are emitted from one of contacts because the contacts are elevated in temperature, again resulting in lower insulation performance immediately after arc extinction as compared to when opening operation is performed without arc ignition.

Resistive element 10L, backward current generation circuits 7L and 7R, and resistive element 10R are connected in series in this order of arrangement between nodes N1 and N2, and in parallel with the whole of semiconductor switches 2L and 2R as well as the whole of mechanical circuit breakers 4L and 4R described above. Backward current generation circuit 7L includes a capacitor 5L and a reactor 6L connected in series with each other. Likewise, backward current generation circuit 7R includes a capacitor 5R and a reactor 6R connected in series with each other. In the case of FIG. 1, capacitors 5L and 5R are disposed adjacent to each other.

Reactors 6L and 6R may be replaced by inductance of the lines of the circuit. Resistive elements 10L and 10R are connected in series with reactors 6L and 6R, respectively, in order to attenuate a backward current. Resistive elements 10L and 10R can also be replaced by resistance of the lines or reactors, and thus do not necessarily have to be provided.

Injection switch 8 is provided on a line connecting a node N3 between mechanical circuit breakers 4L and 4R to a node N4 between capacitors 5L and 5R. Injection switch 8 is formed of a mechanical switch, for example.

Controller 9 controls the timing of opening/closing semiconductor switches 2L and 2R, mechanical circuit breakers 4L and 4R, and injection switch 8.

Lightning arrester 11 is connected between nodes N1 and N2 in parallel with each of the elements described above. Lightning arrester 11 is provided so as to absorb energy of the circuit after interruption of a direct current, and may be omitted.

[Operation of DC Circuit Breaker Device]

Figure 2:
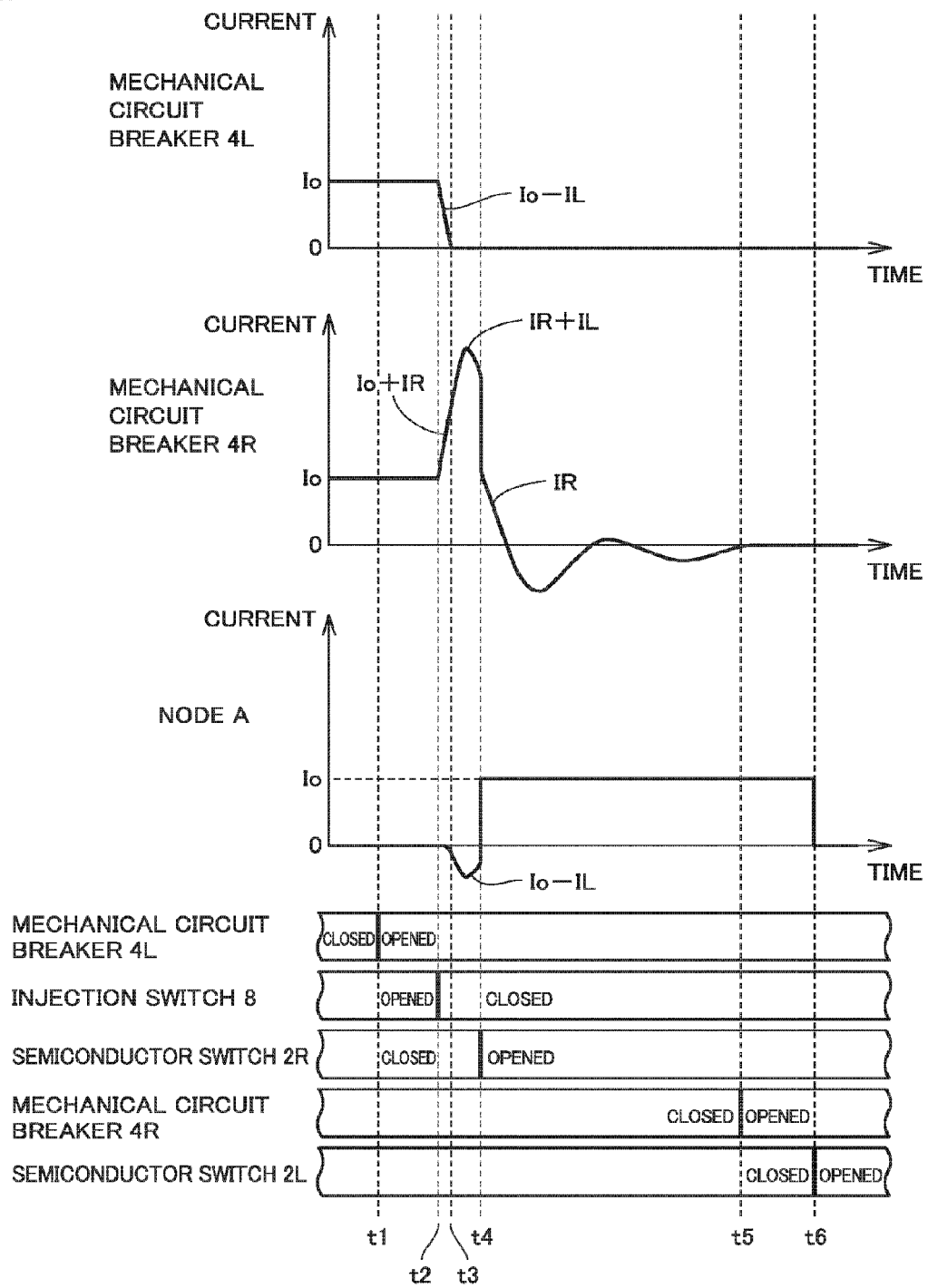
FIG. 2 is a timing diagram showing an operation example from a steady state to an interrupted state of DC circuit breaker device 100 in FIG. 1.

FIG. 2 is a timing diagram showing an operation example from a steady state to an interrupted state of DC circuit breaker device 100 in FIG. 1. From the top, FIG. 2 shows a current flowing through mechanical circuit breaker 4L, a current flowing through mechanical circuit breaker 4R, and a current flowing through connection node A between semiconductor switches 2L and 2R, and further shows an opened/closed state of each of mechanical circuit breaker 4L, injection switch 8, semiconductor switch 2R, mechanical circuit breaker 4R, and semiconductor switch 2L. The operation of DC circuit breaker device 100 will now be described with additional reference to FIGS. 3 to 8 showing a current flowing through DC circuit breaker device 100 at each point of time in FIG. 2.

(Steady State)

Figure 3:
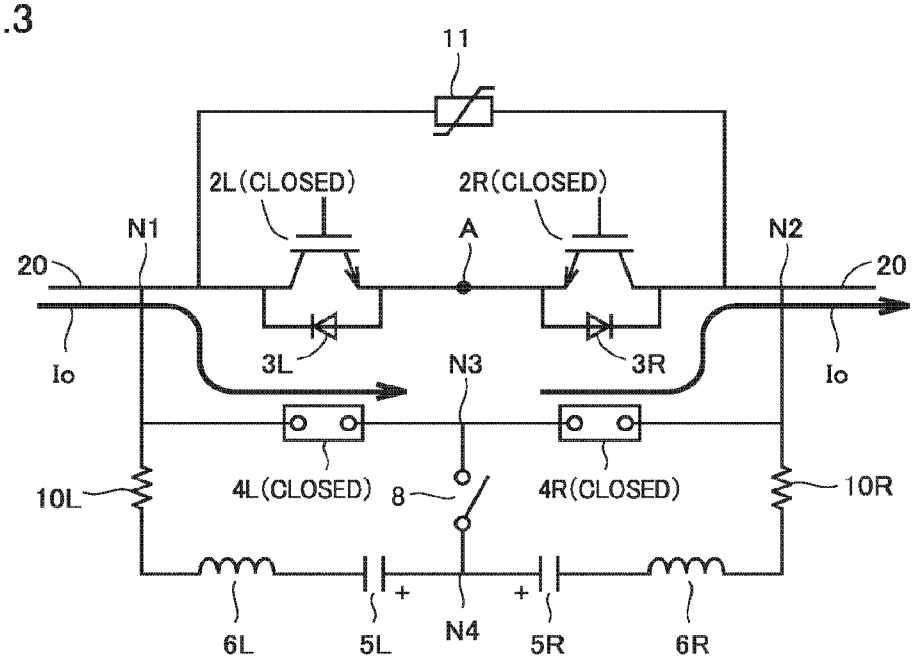
FIG. 3 is a diagram showing a current flowing through DC circuit breaker device 100 in the steady state.

FIG. 3 is a diagram showing a current flowing through DC circuit breaker device 100 in a steady state. Referring to FIGS. 2 and 3, in the steady state (before time t1 in FIG. 2), semiconductor switches 2L and 2R are closed, mechanical circuit breakers 4L and 4R are closed, and injection switch 8 is opened. Capacitors 5L and 5R are charged by a not shown charging device such that they have polarities opposite to each other. For example, in FIG. 3, the capacitors are charged such that the right side electrode (close to node N4) of capacitor 5L and the left side electrode (close to node N4) of capacitor 5R are both positive electrodes.

A direct current Io flowing through main circuit line 20 in the steady state is strictly split into semiconductor switches 2L and 2R and mechanical circuit breakers 4L and 4R and flows through them. When DC circuit breaker device 100 is used in an extra-high voltage DC system, however, semiconductor elements forming semiconductor switches 2L and 2R need to be provided in series to form a multistage structure so as to withstand a high voltage. Accordingly, a resistance value when semiconductor switches 2L and 2R are closed (also referred to as "ON resistance") is much higher than a resistance value of the metallic contacts when mechanical circuit breakers 4L and 4R are closed. It can therefore be considered that the current is mostly flowing through mechanical circuit breakers 4L and 4R.

Depending on the operation state of the DC system, main circuit current Io may flow in a rightward direction (direction from node N1 to node N2) or in a leftward direction (direction from node N2 to node N1) in FIG. 3. Described below is an example where the current flows in the rightward direction (direction from node N1 to node N2) as shown in FIG. 3. When the current flows in the leftward direction, the following description applies with the arrangement symmetrically reversed.

(Turn-on of Injection Switch 8)

Injection switch 8 is turned on at time t2 in FIG. 2. Opening of mechanical circuit breaker 4L may be started simultaneously with the closing of injection switch 8, or before the closing of injection switch 8, or during a time until the value of a current flowing through mechanical circuit breaker 4L becomes zero. In FIG. 2, the opening of mechanical circuit breaker 4L is started at time t1 before the closing of injection switch 8.

Figure 4:
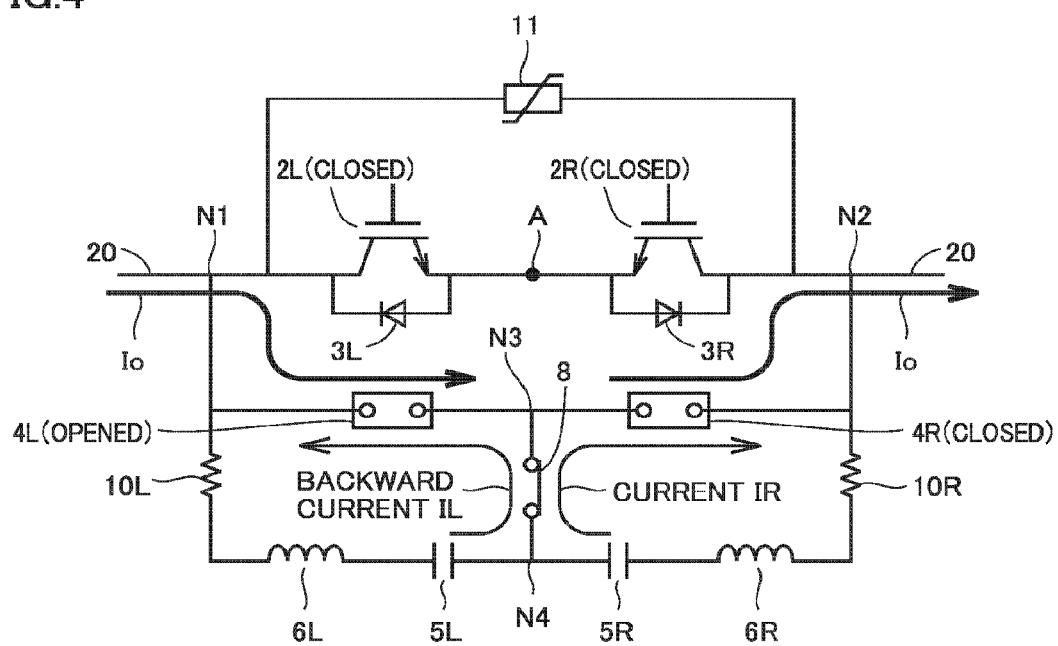

FIG. 4 is a diagram showing a current flow when injection switch 8 is turned on. When injection switch 8 is turned on, electric charge stored in capacitors 5L and 5R in the steady state is discharged to cause a current flow. Thereby, a current IL in an opposite direction to that of main circuit direct current Io flows through mechanical circuit breaker 4L. A current IR in the same direction as that of main circuit direct current Io flows through mechanical circuit breaker 4R.

Current IL is an oscillating current having a frequency determined by the capacitance of capacitor 5L and the inductance of reactor 6L. Although an absolute value of current IL increases immediately after the turn-on of injection switch 8, it is represented as a negative value in the current waveform of FIG. 2 because it is in the opposite direction to that of main circuit direct current Io. When the absolute value of current IL becomes equal to the value of main circuit current Io, the value of the current flowing through mechanical circuit breaker 4L becomes zero. At this moment of zero current (time t3 in FIG. 2), the current flowing through mechanical circuit breaker 4L is interrupted (namely, the arc is extinguished).

(Arc Extinction in Mechanical Circuit Breaker 4L)

Figure 5:
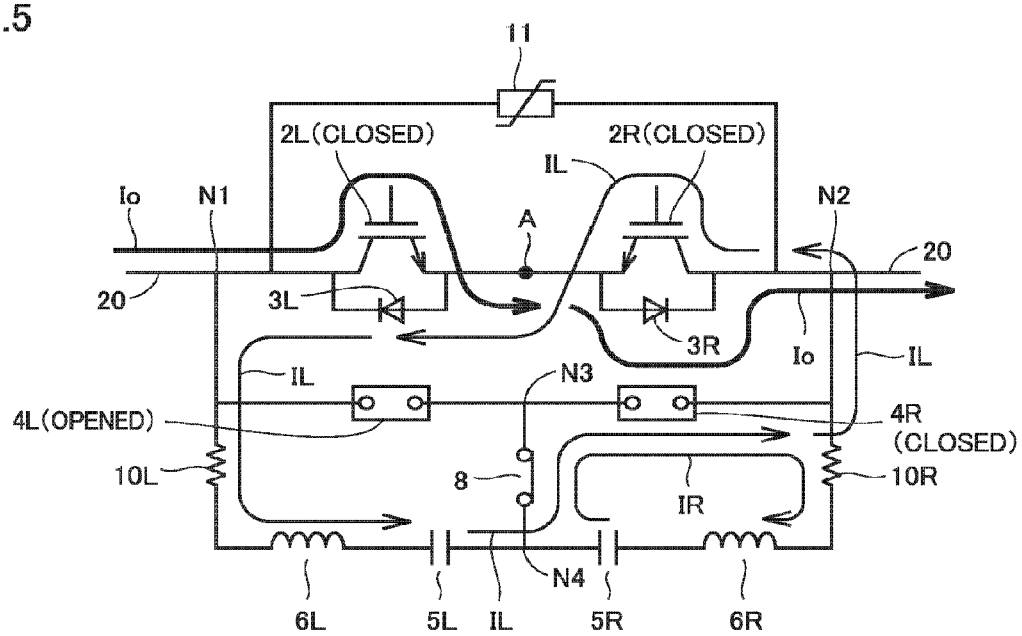
FIG. 5 is a diagram showing a current flow when a current flowing through a mechanical circuit breaker 4L has been interrupted.

FIG. 5 is a diagram showing a current flow when the current flowing through mechanical circuit breaker 4L has been interrupted. As shown in FIG. 5, as a result of the arc extinction in mechanical circuit breaker 4L at time t3 in FIG. 2, main circuit current Io is commutated to semiconductor switch 2L and diode 3R.

On the other hand, current IL flows through a path that goes through mechanical circuit breaker 4R, passes through semiconductor switch 2R and diode 3L, and returns to capacitor 5L. If opening of mechanical circuit breaker 4R is started simultaneously with the opening of mechanical circuit breaker 4L, a current which is a sum of direct current Io and current IR initially flows through mechanical circuit breaker 4R, and after time t3 when mechanical circuit breaker 4L is opened, a current which is a sum of current IL and current IR flows through mechanical circuit breaker 4R, causing ignition of an arc of a high current. This results in wear of and damage to the contacts to lower the insulation performance, as discussed above. Thus, mechanical circuit breaker 4R is controlled so as not to be opened yet at time t3.

However, if mechanical circuit breaker 4R is opened early and attains dielectric strength, a recovery voltage currently maintained only by mechanical circuit breaker 4L can be held by both mechanical circuit breakers 4L and 4R, thus achieving high insulation performance. In addition, it is unnecessary to increase the insulation performance of one of the mechanical circuit breakers, thus allowing for an inexpensive configuration. To that end, at least current IL should be interrupted early.

It is noted that the problem caused by the simultaneous opening of mechanical circuit breakers 4R and 4L as described above is peculiar to DC circuit breaker device 100 having the configuration of FIG. 1.

(Opening of Semiconductor Switch 2R)

In order to interrupt current IL early, semiconductor switch 2R is opened at time t4 immediately after time t3 in FIG. 2. Semiconductor switch 2R may be opened in advance in the steady state, if possible, but is opened at this point of time if the switch needs to be closed for operation. Current IL is thus interrupted. Current IR is attenuated by resistive element 10R.

Figure 6:
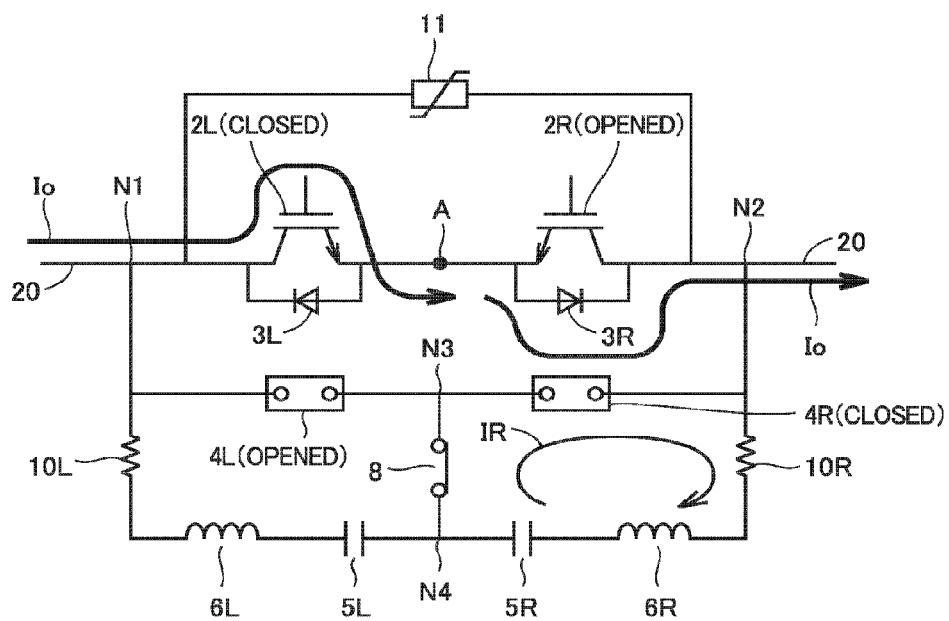
FIG. 6 is a diagram showing a state in which a current IL has been interrupted.

FIG. 6 is a diagram showing a state in which current IL has been interrupted. When current IR is attenuated, only main circuit current Io flows through semiconductor switch 2L and diode 3R.

(Opening of Mechanical Circuit Breaker 4R)

Figure 7:
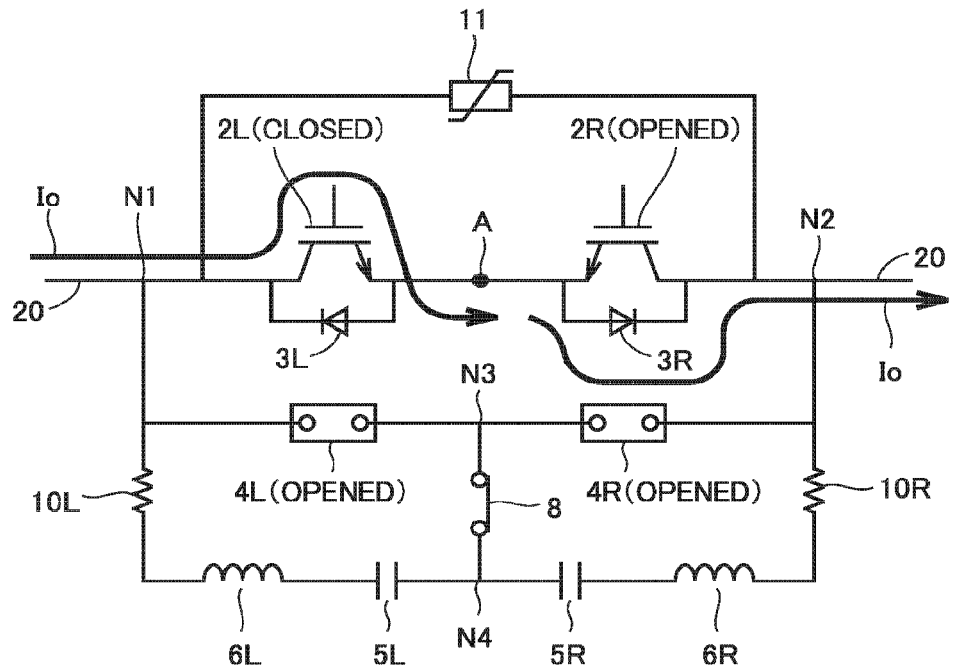
FIG. 7 is a diagram showing a state in which a mechanical circuit breaker 4R has been opened.

Mechanical circuit breaker 4R is opened at time t5 in FIG. 2 when current TR has been attenuated. FIG. 7 is a diagram showing a state in which mechanical circuit breaker 4R has been opened. Mechanical circuit breaker 4R can achieve high insulation performance because an arc is not ignited therein. If an arc is ignited, ignition of an arc of a current small enough not to affect the insulation performance is allowed. If the contacts are not immediately apart from each other, a driving device can start driving operation for opening at a point of time before time t5.

(Opening of Semiconductor Switch 2L)

Figure 8:
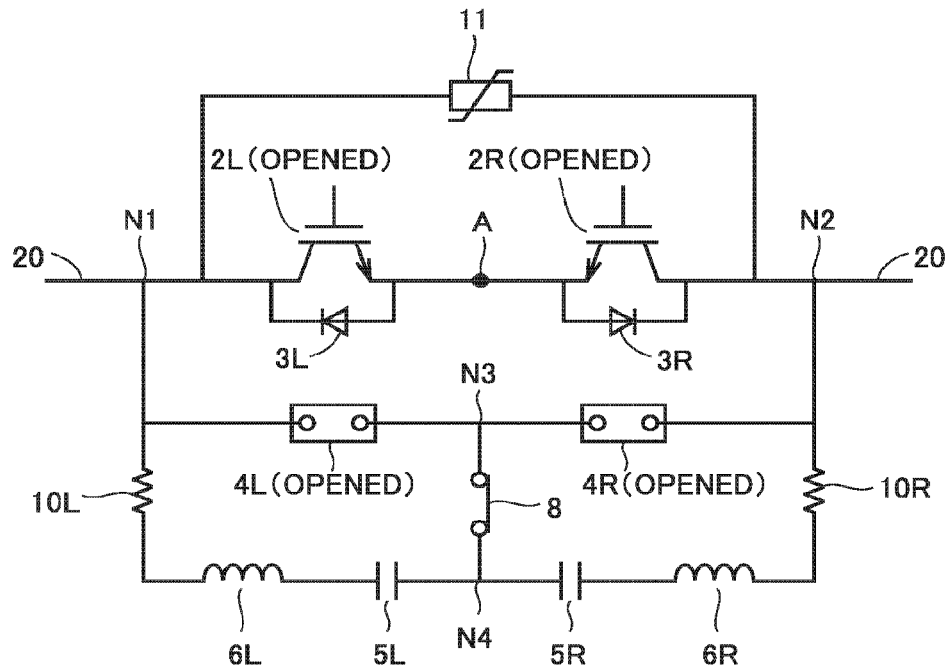
FIG. 8 is a diagram showing a state in which a semiconductor switch 2L has been opened.

FIG. 8 is a diagram showing a state in which semiconductor switch 2L has been opened. Semiconductor switch 2L is opened as shown in FIG. 8 in a state where mechanical circuit breakers 4L and 4R have attained dielectric strength enough to withstand a transient recovery voltage after interruption of the main circuit current even if semiconductor switch 2L is opened, namely, in a state where a sufficient distance between the contacts has been obtained (time t6 in FIG. 2). The current interruption is thus completed. Lightning arrester 11 limits the transient recovery voltage generated by the interruption, and absorbs remaining energy of the system.

[Flowchart of Operation Procedure]

Figure 9:
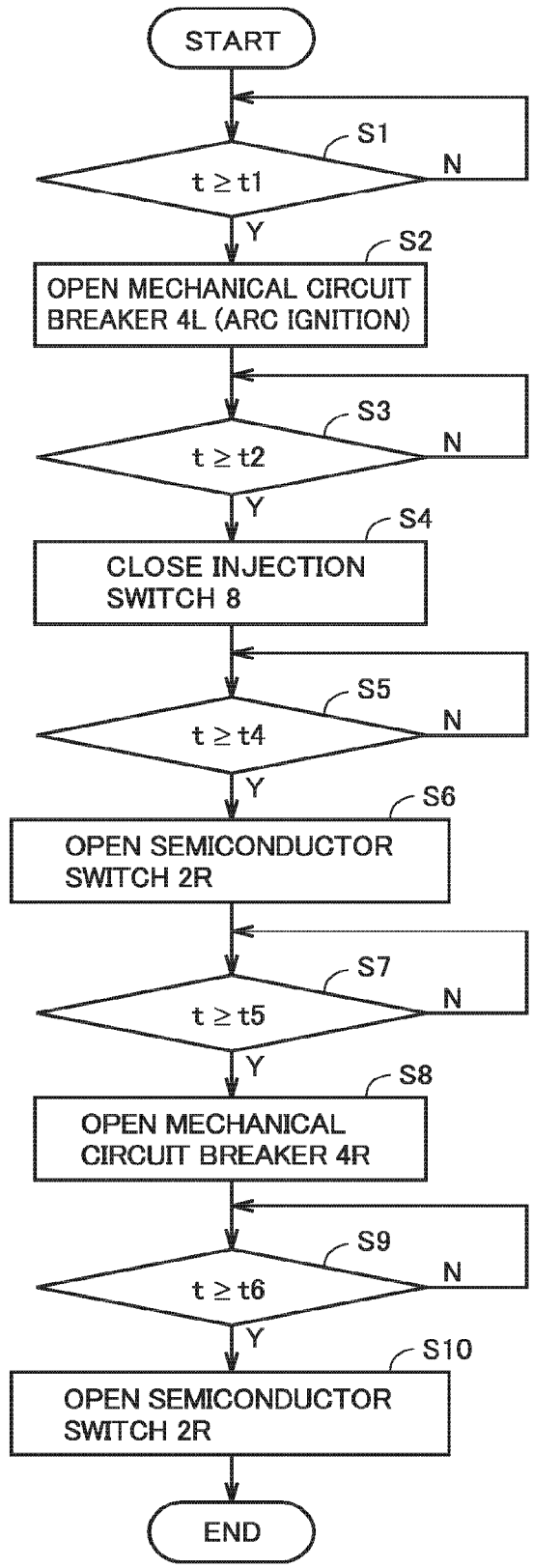
FIG. 9 is a flowchart showing an operation procedure of the DC circuit breaker device.

FIG. 9 is a flowchart showing an operation procedure of the DC circuit breaker device. The operation procedure of the DC circuit breaker device as described above is indicated below as a flowchart. Following the procedure indicated in the flowchart below, controller 9 issues signals for opening/closing the devices forming the DC circuit breaker device.

First, in step S1, if time t is now the aforementioned time t1, the procedure proceeds to step S2. In step S2, mechanical circuit breaker 4L is opened. In step S3, if controller 9 determines that time t is now the aforementioned time t2, the procedure proceeds to step S4. In step S4, injection switch 8 is closed. Then, the current is interrupted by mechanical circuit breaker 4L. Then, in step S5, if controller 9 determines that time t is now the aforementioned time t4, the procedure proceeds to step S6. In step S6, semiconductor switch 2R is opened. In step S7, if controller 9 determines that time t is now the aforementioned time t5, the procedure proceeds to step S8. In step S8, mechanical circuit breaker 4R is opened. In step S9, if controller 9 determines that time t is now the aforementioned time t6, the procedure proceeds to step S10. In step S10, semiconductor switch 2L is opened.

As described above, according to DC circuit breaker device 100 of the first embodiment, an inexpensive DC circuit breaker device having high insulation performance can be provided while a bidirectional direct current is interrupted and wear and damage caused by an arc is reduced.

<Variation of First Embodiment>

While semiconductor switches 2L and 2R are closed in the steady state in the above description, these switches may be opened in the steady state and closed immediately before injection switch 8 is turned on.

Instead of being a mechanical switch, injection switch 8 may be, for example, a discharge switch such as a gap switch, or a semiconductor switch such as a thyristor or IGBT. Alternatively, if injection switch 8 is not too expensive, a switch having the current interruption capability may be applied to injection switch 8 to thereby interrupt current IL and current IR.

In the above description, semiconductor switch 2R is closed in the steady state. The reason for this is that if semiconductor switch 2R is always opened, a voltage is always applied to semiconductor switch 2R, albeit a voltage corresponding to a voltage drop of the diode, and this voltage stress can be avoided by closing the switch. Another reason is that upon application of an overvoltage or overcurrent externally induced by lightning or the like, if semiconductor switch 2R is always closed, such overvoltage or overcurrent can be absorbed by a closed loop of diode 3L and semiconductor switch 2R to protect semiconductor switch 2R and diode 3L.

However, semiconductor switch 2R may be opened in the steady state. A supplementary description of the operation of DC circuit breaker device 100 in this case is provided below.

Figure 10:
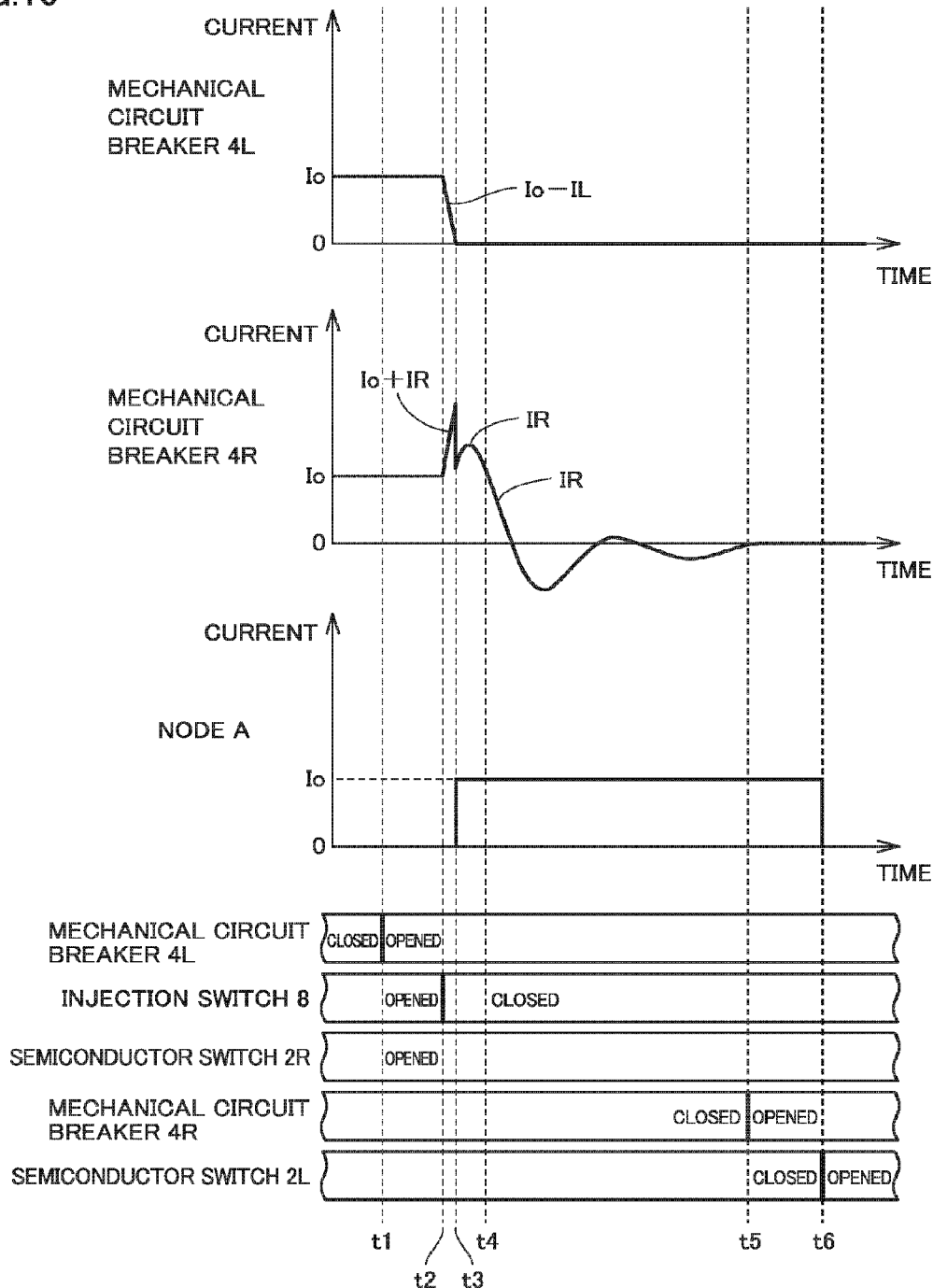
FIG. 10 is a timing diagram showing another operation example from the steady state to the interrupted state of DC circuit breaker device 100 (when a semiconductor switch 2R is opened in advance).

FIG. 10 is a timing diagram showing another operation example from the steady state to the interrupted state of DC circuit breaker device 100 (when semiconductor switch 2R is opened in advance). Referring to FIG. 10, when semiconductor switch 2R is opened in advance, backward current IL is also interrupted at time t3 when an arc is extinguished in mechanical circuit breaker 4L. Energy of backward current IL is absorbed by lightning arrester 11. The operation is otherwise the same as that of FIG. 2 and thus the description thereof will not be repeated.

In the first embodiment, when each of semiconductor switches 2L and 2R is formed of an IGBT as shown in FIG. 1 and the like, both semiconductor switches 2L and 2R are connected together at the emitter sides of the IGBTs. Conversely, both semiconductor switches 2L and 2R may be connected together at the collector sides of the IGBTs. A supplementary description is provided below with reference to the drawings.

Figure 11:
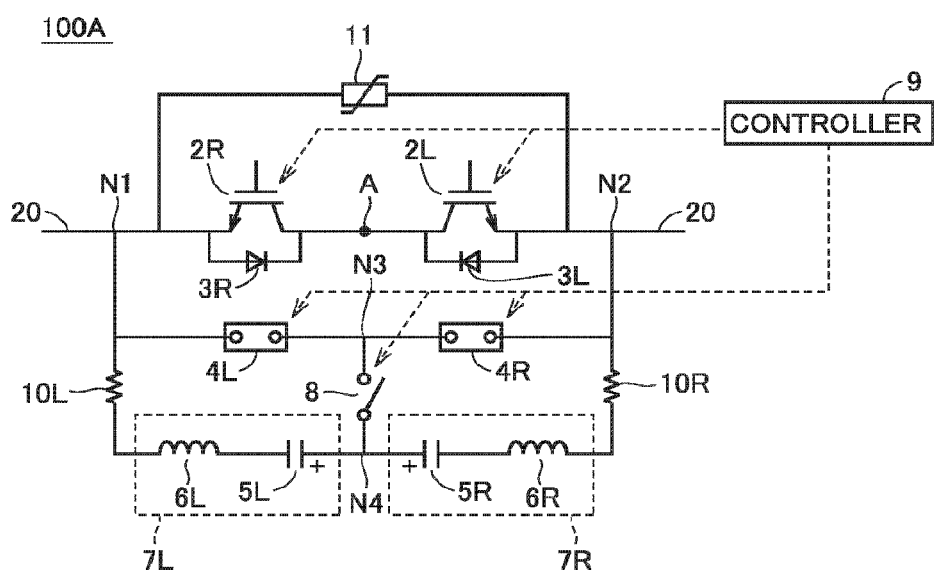
FIG. 11 is a circuit diagram showing a configuration of a DC circuit breaker device according to a variation of the first embodiment.

FIG. 11 is a circuit diagram showing a configuration of a DC circuit breaker device according to a variation of the first embodiment. In a DC circuit breaker device 100A of FIG. 11, a pair of semiconductor switch 2L and diode 3L and a pair of semiconductor switch 2R and diode 3R are disposed in a manner opposite to that of DC circuit breaker device 100 in FIG. 1. That is, semiconductor switch 2L is connected between node A and node N2 such that the direction from node N1 to node N2 is its current-carrying direction. Semiconductor switch 2R is connected between node A and node N1 such that the direction from node N2 to node N1 is its current-carrying direction. Diodes 3L and 3R correspond to semiconductor switches 2L and 2R, respectively, each diode being connected in parallel with the corresponding semiconductor switch so as to carry a current in a direction opposite to the current-carrying direction of the corresponding semiconductor switch. The other components in FIG. 11 are connected in the same manner as that of FIG. 1.

An operation procedure of DC circuit breaker device 100A in FIG. 11 is the same as the operation procedure of DC circuit breaker device 100 in FIG. 1. For example, the timing diagram of FIG. 2 and the flowchart of FIG. 9 are applied without change to DC circuit breaker device 100A in FIG. 11, except that it is semiconductor switch 2R close to node N1 that is opened at time t4 (step S6), and it is semiconductor switch 2L close to node N2 that is opened at time t6 (step S10). DC circuit breaker device 100A in FIG. 11 is different from DC circuit breaker device 100 in FIG. 1 in this respect.

Second Embodiment

Figure 12:
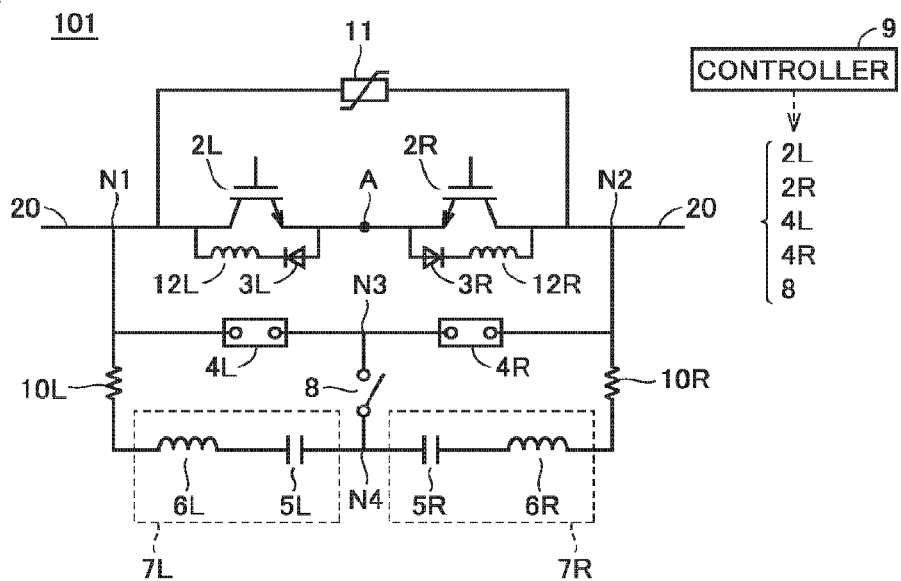
FIG. 12 is a circuit diagram of a DC circuit breaker device 101 according to a second embodiment.

FIG. 12 is a circuit diagram of a DC circuit breaker device 101 according to a second embodiment.

DC circuit breaker device 101 in FIG. 12 is different from DC circuit breaker device 100 in FIG. 1 in that it further includes a high-frequency cutting reactor 12L connected in series with diode 3L, and a high-frequency cutting reactor 12R connected in series with diode 3R. Diode 3L and high-frequency cutting reactor 12L are connected in parallel with semiconductor switch 2L, and diode 3R and high-frequency cutting reactor 12R are connected in parallel with semiconductor switch 2R. High-frequency cutting reactors 12L and 12R have the function of carrying a direct current but cutting a high-frequency oscillating current, namely, a temporally varying current, by inductance to prevent the flow (an element having such function is referred herein as an "inductance element"). Instead of reactors 6L and 6R, ferrite cores or the like may be provided as inductance elements.

The configuration of FIG. 12 is otherwise the same as that of the first embodiment shown in FIG. 1, and thus the same or corresponding parts are designated by the same reference signs and the description thereof will not be repeated. The effect of high-frequency cutting reactors 12L and 12R is now described.

Figure 13:
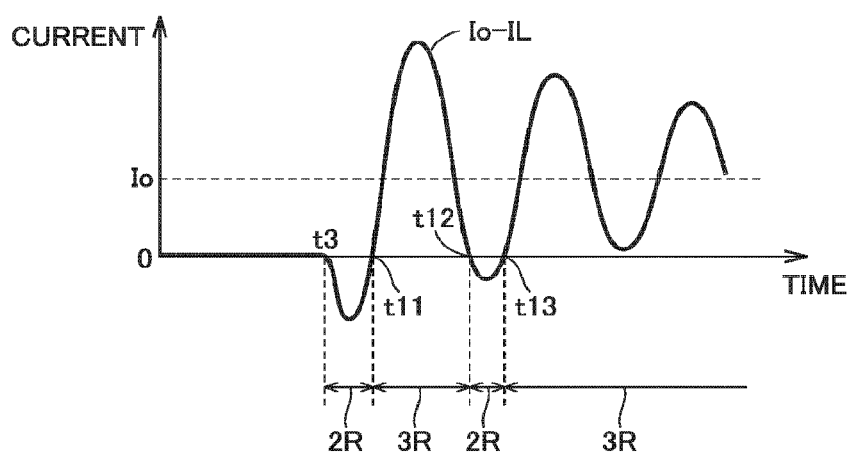
FIG. 13 is a diagram showing a current waveform at a node A after mechanical circuit breaker 4L is opened in DC circuit breaker device 100 shown in FIG. 1.

FIG. 13 is a diagram showing a current waveform at node A after mechanical circuit breaker 4L is opened in DC circuit breaker device 100 shown in FIG. 1. A current flowing rightward (direction from node N1 to node N2) through point A in FIG. 1 is represented as a positive current.

Referring to FIG. 13, mechanical circuit breaker 4L is opened at time t3 in FIG. 10. While semiconductor switch 2R is opened at time t4 immediately after time t3 in FIG. 2, semiconductor switch 2R remains closed in FIG. 13. After the opening of mechanical circuit breaker 4L, a current in which main circuit current Io and backward current IL which is an oscillating current are superimposed on each other flows through point A. Until semiconductor switch 2R is opened, backward current IL has a waveform which is attenuated by resistive element 10L. Between times t3 and t11 and between times t12 and t13 in FIG. 13, a current Io-IL flowing through point A has a negative value, causing a current to flow through semiconductor switch 2R. In the other periods of time, on the other hand, current Io-IL flowing through point A has a positive value, causing a current to flow through diode 3R.

Thus, backward current IL is interrupted by semiconductor switch 2R only when the current flowing through point A has a negative value. This leads to a problem in that backward current IL cannot be interrupted by semiconductor switch 2R when a negative area no longer exists due to the attenuation (after time t13). This problem is peculiar to DC circuit breaker device 100 having the configuration of FIG. 1, and does not occur in the conventional DC circuit breaker devices disclosed in Japanese Patent Laying-Open No. 59-128714 (PTD 1) and Japanese Patent Laying-Open No. 10-126961 (PTD 2).

If high-frequency cutting reactor 12R is provided in series with diode 3R as shown in FIG. 12, backward current IL which is a high-frequency oscillating current does not flow through diode 3R, and thus backward current IL flows through semiconductor switch 2R. Thereby, backward current IL can be readily interrupted by semiconductor switch 2R. Likewise, high-frequency cutting reactor 12L is provided in series with diode 3L.

With the configuration described above, backward current IL can be reliably interrupted. Thus, an inexpensive DC circuit breaker device having high insulation performance can be provided while wear and damage caused by an arc is reduced.

Third Embodiment

Figure 14:
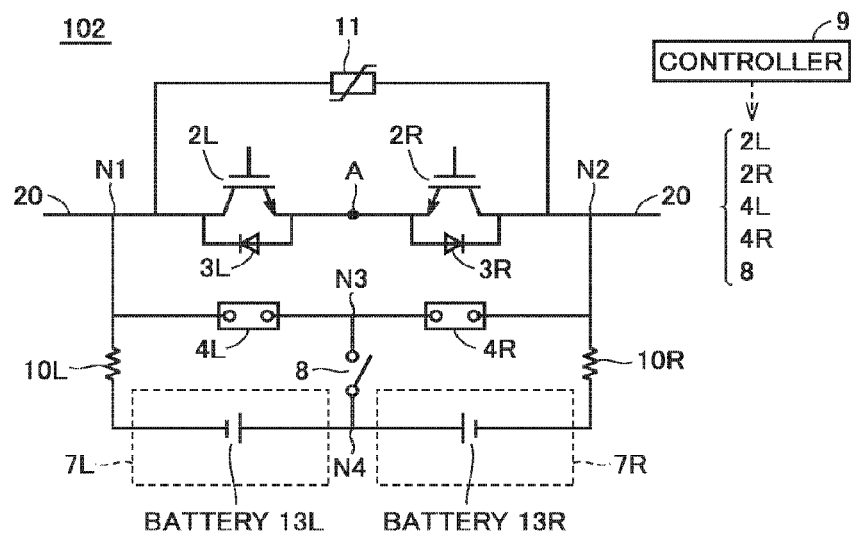
FIG. 14 is a circuit diagram of a DC circuit breaker device 102 according to a third embodiment.

FIG. 14 is a circuit diagram of a DC circuit breaker device 102 according to a third embodiment.

DC circuit breaker device 102 in FIG. 14 is different from DC circuit breaker device 101 in FIG. 1 in the configuration of backward current generation circuits 7L and 7R. That is, backward current generation circuit 7L in FIG. 14 is different from backward current generation circuit 7L in FIG. 1 in that it includes a battery 13L instead of capacitor 5L and reactor 6L. Likewise, backward current generation circuit 7R in FIG. 14 is different from backward current generation circuit 7R in FIG. 1 in that it includes a battery 13R instead of capacitor 5R and reactor 6R. Battery 13L is connected so as to have the positive electrode close to node N4 and have the negative electrode close to node N1. Likewise, battery 13R is connected so as to have the positive electrode close to node N4 and have the negative electrode close to node N2. The configuration of FIG. 14 is otherwise the same as that of FIG. 1, and thus the same or corresponding parts are designated by the same reference signs and the description thereof will not be repeated.

By using batteries 13L and 13R, a backward current can also be passed through their corresponding mechanical circuit breakers 4L and 4R. The circuit configuration is advantageously simplified since the charger for charging capacitors 5L and 5R in FIG. 1 is not required.

If a resistance value of each of resistive elements 10L and 10R in FIG. 14 is represented as r, an output voltage V of each of batteries 13L and 13R needs to be greater than the product of main circuit current Io and resistance value r. If the magnitude of main circuit current Io, which varies depending on the DC power system, is 1 kA, for example, and resistance value r is 1Ω, then output voltage V needs to be greater than 1 kA.

Figure 15:
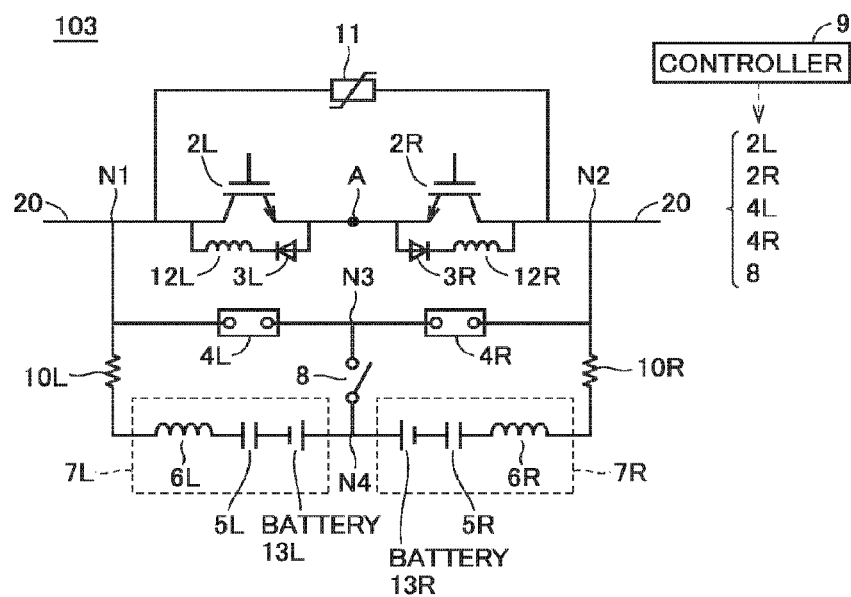
FIG. 15 is a circuit diagram of a DC circuit breaker device 103 according to a variation of the third embodiment.

FIG. 15 is a circuit diagram of a DC circuit breaker device 103 according to a variation of the third embodiment. The circuit diagram of FIG. 14 shows an example where only batteries 13L and 13R are used as backward current generation circuits 7L and 7R, respectively. Instead, the configuration may be such that the batteries are added in series with the capacitors and the reactors in FIGS. 1 and 12. For example, backward current generation circuits 7L and 7R in FIG. 15 are each configured by adding the battery to the configuration of FIG. 10 (second embodiment). In this case, charging voltage of the capacitors can be reduced and less output voltage of the batteries is required, so that inexpensive batteries can be used.

It is noted that the configurations of backward current generation circuits 7L and 7R in FIGS. 14 and 15 can be applied to any of DC circuit breaker devices 100 and 100A of the first embodiment as well as DC circuit breaker device 101 of the second embodiment.

Fourth Embodiment

Figure 16:
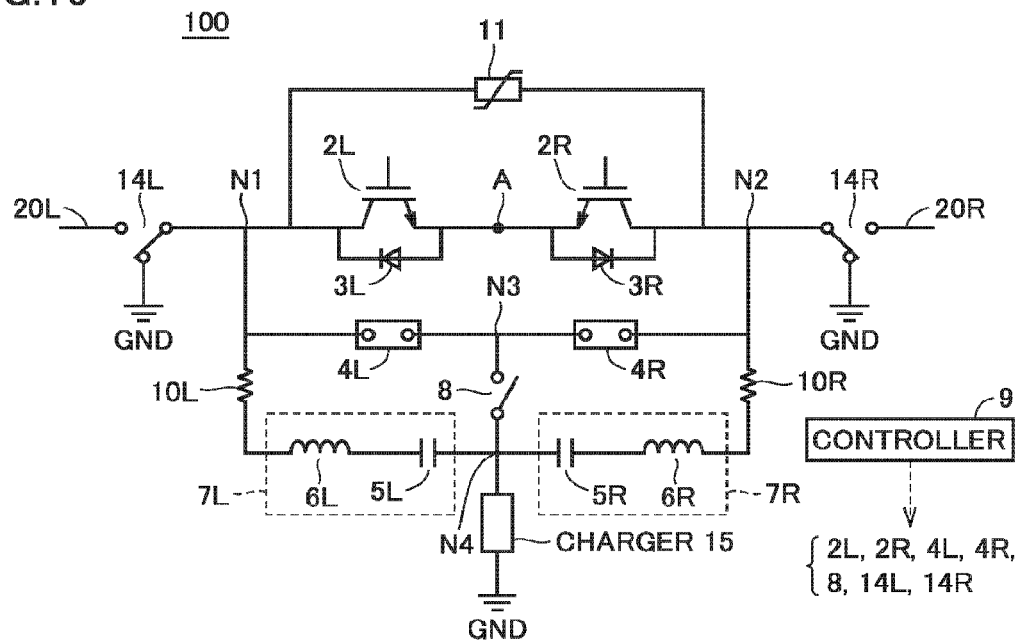
FIG. 16 is a diagram showing an example of a method of charging capacitors 5L and 5R in DC circuit breaker device 100 of the first embodiment shown in FIG. 1.

FIG. 16 is a diagram showing an example of a method of charging capacitors 5L and 5R in DC circuit breaker device 100 of the first embodiment shown in FIG. 1.

Referring to FIG. 16, a charger 15 is connected between node N4 between capacitors 5L and 5R and a ground node GND. A disconnector 14L with a grounding switch is inserted in a main circuit line 20L adjacent to node N1 of DC circuit breaker device 100. A disconnector 14R with a grounding switch is inserted in a main circuit line 20R adjacent to node N2 of DC circuit breaker device 100.

During charging of capacitors 5L and 5R, as shown in FIG. 16, DC circuit breaker device 100 is disconnected from main circuit lines 20L and 20R and grounded by opening disconnectors 14L and 14R with a grounding switch. That is, electricity is not supplied to DC circuit breaker device 100. Injection switch 8 is opened. In this state, both capacitors 5L and 5R can be simultaneously charged by charger 15. Charging is possible in the same way in DC circuit breaker device 101 of the second embodiment.

Fifth Embodiment

Figure 17:
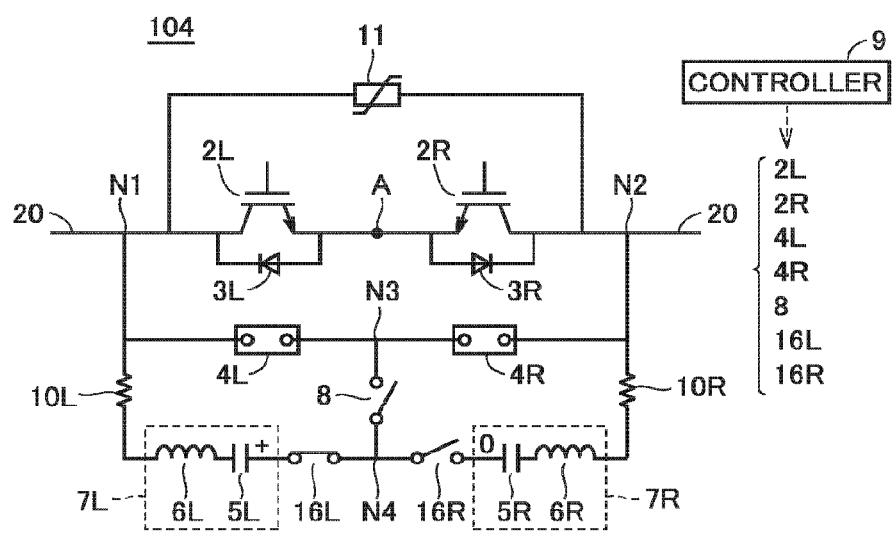
FIG. 17 is a circuit diagram showing a DC circuit breaker device 104 according to a fifth embodiment.

FIG. 17 is a circuit diagram showing a DC circuit breaker device 104 according to a fifth embodiment Referring to FIG. 17, DC circuit breaker device 104 is different from DC circuit breaker device 100 in FIG. 1 in that it further includes mechanical switches 16L and 16R. Mechanical switch 16L is connected between node N4 and capacitor 5L, and mechanical switch 16R is connected between node N4 and capacitor 5R. The configuration of FIG. 17 is otherwise the same as that of DC circuit breaker device 100 in FIG. 1, and thus the same or corresponding parts are designated by the same reference signs and the description thereof will not be repeated.

Figure 18:
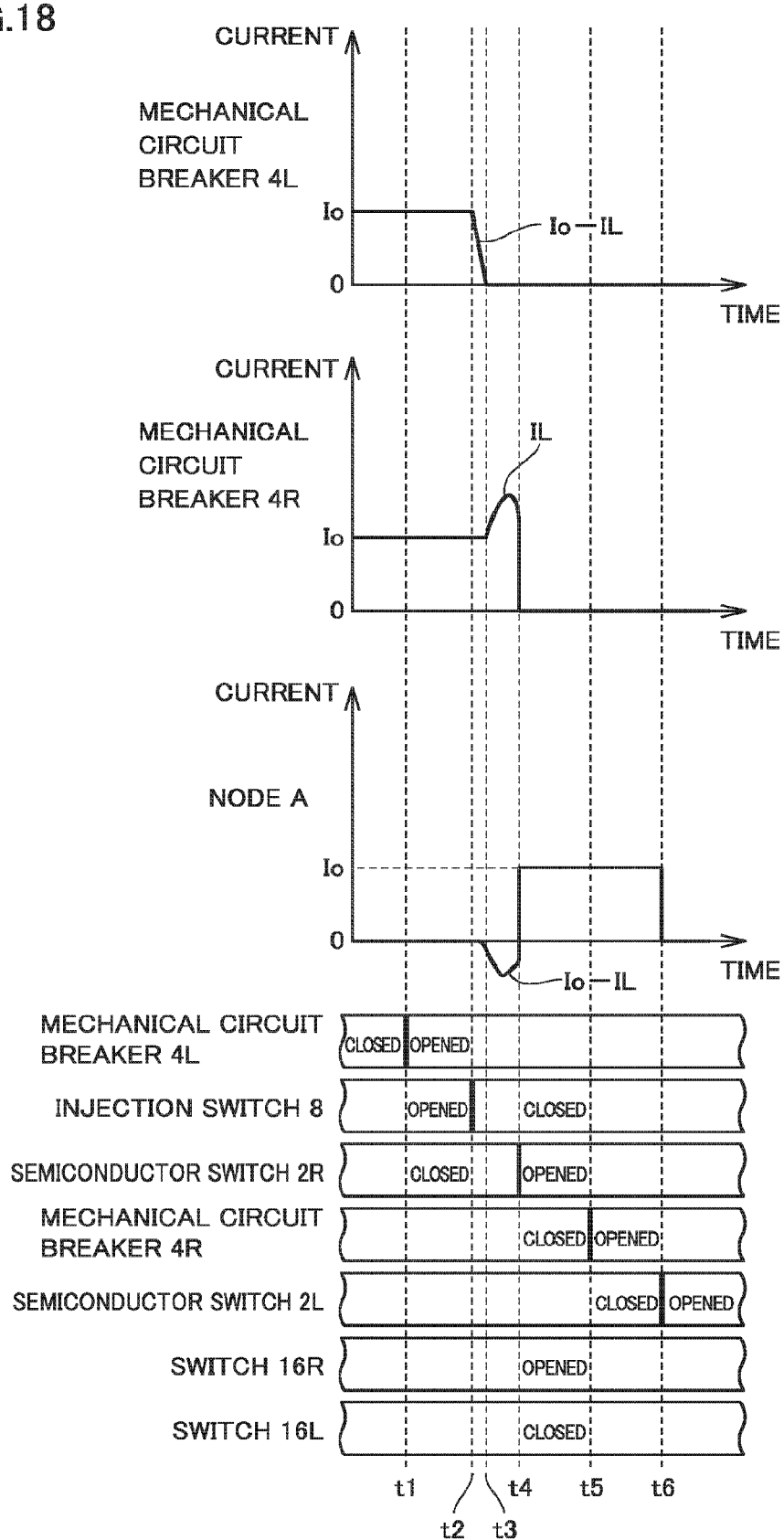
FIG. 18 is a timing diagram showing an operation example from a steady state to an interrupted state of DC circuit breaker device 104 in FIG. 17.

FIG. 18 is a timing diagram showing an operation example from a steady state to an interrupted state of DC circuit breaker device 104 in FIG. 17. Referring to FIGS. 17 and 18, in the steady state (before time t1), main circuit current Io flows in the direction from nodes N1 to N2 in FIG. 17. Mechanical switch 16L is always closed, and mechanical switch 16R is always opened. Capacitor 5L is charged in advance so as to have the positive side close to node N4. Capacitor 5R is not charged. As shown in FIG. 18, in the steady state (before time t1), semiconductor switches 2L and 2R are closed, mechanical circuit breakers 4L and 4R are closed, and injection switch 8 is opened.

In a manner similar to that of FIG. 2, mechanical circuit breaker 4L is opened at time t1, and injection switch 8 is turned on at time t2. Thereby, backward current IL flows through mechanical circuit breaker 4L as in the first embodiment, whereas current IR does not flow through mechanical circuit breaker 4R since mechanical switch 16R is opened.

Then, when current Io-IL flowing through mechanical circuit breaker 4L becomes zero, an arc is extinguished in mechanical circuit breaker 4L. Thereby, main circuit current Io is commutated to semiconductor switch 2L and diode 3R. On the other hand, current IL flows through a path that goes through mechanical circuit breaker 4R, passes through semiconductor switch 2R and diode 3L, and returns to capacitor 5L.

At time t4, current IL is interrupted by opening semiconductor switch 2R. Energy of this current IL is absorbed by lightning arrester 11. With current IR not flowing in the fifth embodiment, mechanical circuit breaker 4R can be opened immediately thereafter (at time t5). After mechanical circuit breaker 4R is opened, semiconductor switch 2L is opened to complete the current interruption.

Figure 19:
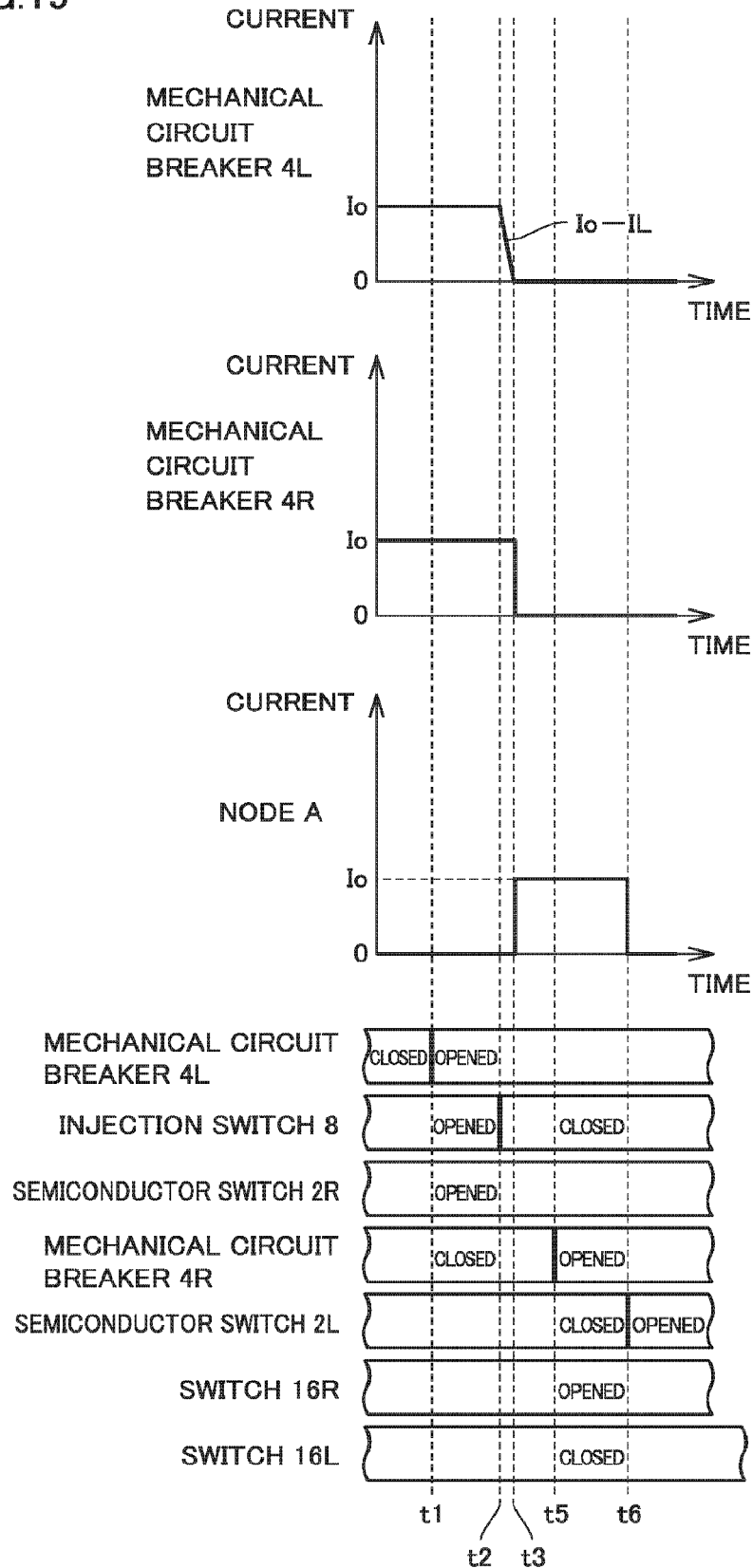
FIG. 19 is a timing diagram showing another operation example from the steady state to the interrupted state of DC circuit breaker device 104 in FIG. 17 (when semiconductor switch 2R is opened in advance).

FIG. 19 is a timing diagram showing another operation example from the steady state to the interrupted state of DC circuit breaker device 104 in FIG. 17 (when semiconductor switch 2R is opened in advance). The timing diagram of FIG. 19 is different from the timing diagram of FIG. 18 in that semiconductor switch 2R is opened in advance in the steady state. Referring to FIG. 19, if semiconductor switch 2R is opened in advance, backward current IL is also interrupted at time t3 when an arc is extinguished in mechanical circuit breaker 4L. Energy of backward current IL is absorbed by lightning arrester 11. The operation is otherwise the same as that of FIG. 18 and thus the description thereof will not be repeated.

It is noted that the configuration including mechanical switches 16R and 16L can be also be applied to DC circuit breaker device 101 of the second embodiment.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 2L, 2R semiconductor switch; 3L, 3R diode; 4L, 4R mechanical circuit breaker; 5L, 5R capacitor; 6L, 6R reactor; 7L, 7R backward current generation circuit; 8 injection switch; 9 controller; 10L, 10R resistive element; 11 lightning arrester; 12L, 12R high-frequency cutting reactor; 13L, 13R battery; 14L, 14R disconnector with grounding switch; 15 charger; 16L, 16R mechanical switch; 20, 20L, 20R main circuit line; 100 to 104 DC circuit breaker device.

The invention claimed is:

1. A DC circuit breaker device comprising:
a first semiconductor switch and a second semiconductor switch connected in series between a first node on a main circuit line and a second node on the main circuit line such that current-carrying directions of the switches are opposite to each other;
a first diode connected in parallel with the first semiconductor switch to carry a current in a direction opposite to the current-carrying direction of the first semiconductor switch;
a second diode connected in parallel with the second semiconductor switch to carry a current in a direction opposite to the current-carrying direction of the second semiconductor switch;
a first mechanical circuit breaker and a second mechanical circuit breaker successively connected in series between the first node and the second node, and connected in parallel with the whole of the first semiconductor switch and the second semiconductor switch;
a first backward current generation circuit and a second backward current generation circuit successively connected in series between the first node and the second node, and connected in parallel with the whole of the first semiconductor switch and the second semiconductor switch and in parallel with the whole of the first mechanical circuit breaker and the second mechanical circuit breaker, to pass a backward current through the first mechanical circuit breaker and the second mechanical circuit breaker, respectively;
an injection switch connected between a third node between the first mechanical circuit breaker and the second mechanical circuit breaker and a fourth node between the first backward current generation circuit and the second backward current generation circuit; and
a controller to control timing of opening/closing the first semiconductor switch, the second semiconductor switch, the first mechanical circuit breaker, the second mechanical circuit breaker, and the injection switch.

2. The DC circuit breaker device according to claim 1, wherein
when interrupting a first direct current flowing in a direction from the first node to the second node, the first backward current generation circuit is configured to pass a current in a direction opposite to the direction of the first direct current through the first mechanical circuit breaker by turn-on of the injection switch, and
when interrupting a second direct current flowing in a direction from the second node to the first node, the second backward current generation circuit is configured to pass a current in a direction opposite to the direction of the second direct current through the second mechanical circuit breaker by turn-on of the injection switch.

3. The DC circuit breaker device according to claim 2, wherein
when interrupting the first direct current, the controller is configured to start to open the first mechanical circuit breaker after the turn-on of the injection switch, and then to start to open the second mechanical circuit breaker.

4. The DC circuit breaker device according to claim 2, wherein
when interrupting the first direct current, the controller is configured to start to open the first mechanical circuit breaker before an interruption time at which the current flowing through the first mechanical circuit breaker becomes zero by the turn-on of the injection switch, and to start to open the second mechanical circuit breaker after the interruption time.

5. The DC circuit breaker device according to claim 3, wherein
the first semiconductor switch is connected between the first node and the second node such that the direction from the first node to the second node is the current-carrying direction,
the second semiconductor switch is connected between the first node and the second node such that the direction from the second node to the first node is the current-carrying direction, and
the controller is configured to open the second semiconductor switch before starting to open the second mechanical circuit breaker.

6. The DC circuit breaker device according to claim 5, wherein
the controller is configured to open the first semiconductor switch after opening the second mechanical circuit breaker.

7. The DC circuit breaker device according to claim 1, further comprising:
a first inductance element connected in series with the first diode and in parallel with the first semiconductor switch; and
a second inductance element connected in series with the second diode and in parallel with the second semiconductor switch.

8. The DC circuit breaker device according to claim 1, wherein
the first backward current generation circuit includes a first capacitor and a first reactor connected in series between the fourth node and the first node, and
the second backward current generation circuit includes a second capacitor and a second reactor connected in series between the fourth node and the second node.

9. The DC circuit breaker device according to claim 8, further comprising:
a first disconnector with a grounding switch inserted on the main circuit line adjacent to the first node;
a second disconnector with a grounding switch inserted on the main circuit line adjacent to the second node; and
a charger connected between the fourth node and a ground node.

10. The DC circuit breaker device according to claim 1, wherein
the first backward current generation circuit includes a first battery having a positive electrode close to the fourth node and a negative electrode close to the first node, and
the second backward current generation circuit includes a second battery having a positive electrode close to the fourth node and a negative electrode close to the second node.

11. The DC circuit breaker device according to claim 1, further comprising:
a first mechanical switch connected between the first backward current generation circuit and the fourth node; and
a second mechanical switch connected between the second backward current generation circuit and the fourth node.

* * * * *